United States Patent
Chen et al.

(10) Patent No.: US 12,308,368 B2
(45) Date of Patent: *May 20, 2025

(54) METHOD FOR NON-RESIST NANOLITHOGRAPHY

(71) Applicants: Taiwan Semiconductor Manufacturing Co., Ltd., Hsinchu (TW); National Taiwan University, Taipei (TW)

(72) Inventors: Miin-Jang Chen, Taipei (TW); Kuen-Yu Tsai, Taipei (TW); Chee-Wee Liu, Hsinchu (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/525,131

(22) Filed: Nov. 30, 2023

(65) Prior Publication Data
US 2024/0120409 A1    Apr. 11, 2024

Related U.S. Application Data

(60) Continuation of application No. 18/065,234, filed on Dec. 13, 2022, now Pat. No. 11,855,190, which is a
(Continued)

(51) Int. Cl.
*H01L 29/66*    (2006.01)
*H01L 21/033*    (2006.01)
(Continued)

(52) U.S. Cl.
CPC .... *H01L 29/66795* (2013.01); *H01L 21/3086* (2013.01); *H01L 21/0337* (2013.01);
(Continued)

(58) Field of Classification Search
CPC ........... H01L 29/66795; H01L 21/3086; H01L 21/0337; H01L 21/28132; H01L 21/308;
(Continued)

(56) References Cited

U.S. PATENT DOCUMENTS 7,531,437 B2    5/2009    Brask et al.
9,966,263 B1    5/2018    Li et al.
(Continued)

OTHER PUBLICATIONS

Chen, X., et al., "Atomic layer lithography of wafer-scale nanogap arrays for extreme confinement of electromagnetic waves," Nature Communications, Sep. 3, 2013, pp. 1-7.
(Continued)

*Primary Examiner* — Patricia D Valenzuela
(74) *Attorney, Agent, or Firm* — Slater Matsil, LLP

(57) ABSTRACT

A method for forming a semiconductor device is provided. A first patterned mask is formed on the substrate, the first patterned mask having a first opening therein. A second patterned mask is formed on the substrate in the first opening, the first patterned mask and the second patterned mask forming a combined patterned mask. The combined patterned mask is formed having one or more second openings, wherein one or more unmasked portions of the substrate are exposed. Trenches that correspond to the one or more unmasked portions of the substrate are formed in the substrate in the one or more second openings.

20 Claims, 8 Drawing Sheets

Related U.S. Application Data continuation of application No. 16/883,195, filed on May 26, 2020, now Pat. No. 11,532,729, which is a continuation of application No. 15/962,398, filed on Apr. 25, 2018, now Pat. No. 10,665,696, which is a division of application No. 14/285,281, filed on May 22, 2014, now Pat. No. 9,972,702.

(51) Int. Cl.
*H01L 21/28* (2006.01)
*H01L 21/308* (2006.01)
*H01L 21/311* (2006.01)

(52) U.S. Cl.
CPC .... *H01L 21/0338* (2013.01); *H01L 21/28132* (2013.01); *H01L 21/308* (2013.01); *H01L 21/311* (2013.01); *H01L 21/31144* (2013.01)

(58) Field of Classification Search
CPC ........... H01L 21/31144; H01L 21/0338; H01L 21/311
See application file for complete search history.

(56) References Cited

U.S. PATENT DOCUMENTS

| | | | |
|---|---|---|---|
| 9,972,702 B2 | 5/2018 | Chen et al. | |
| 10,665,696 B2 * | 5/2020 | Chen | H01L 29/66795 |
| 2007/0158756 A1 * | 7/2007 | Dreeskornfeld | H01L 29/66818 257/374 |
| 2008/0148552 A1 | 6/2008 | Pentek et al. | |
| 2009/0162959 A1 | 6/2009 | Hsu et al. | |
| 2012/0040528 A1 | 2/2012 | Kim et al. | |
| 2012/0299099 A1 | 11/2012 | Huang et al. | |
| 2013/0224665 A1 | 8/2013 | Wu et al. | |
| 2013/0252431 A1 * | 9/2013 | Chen | H01L 21/28132 257/E21.249 |
| 2014/0247647 A1 | 9/2014 | Song et al. | |
| 2018/0053687 A1 * | 2/2018 | Lee | H01L 21/0334 |
| 2021/0242020 A1 | 8/2021 | O'Meara et al. | |
| 2022/0005703 A1 | 1/2022 | Jen et al. | |

OTHER PUBLICATIONS

Dhuey, S. et al., "Obtaining nanoimprint template gratings with 10 nm half-pitch by atomic later deposition enabled spacer double patterning," IOP Publishing Ltd., Nanotechnology 24 (2013) 105303, 5 pages.

Tan, L.K., et al., "Combining Atomic Layer Deposition with a Template-Assisted Approach to Fabricate Size-Reduced Nanowire Arrays on Substrates and Their Electrochemical Characterization," J. Phys. Chem. C 2007, vol. 111, No. 13, pp. 4964-4968.

* cited by examiner

METHOD FOR NON-RESIST NANOLITHOGRAPHY

PRIORITY CLAIM

This application is a continuation of U.S. patent application Ser. No. 18/065,234, filed on Dec. 13, 2022, which is a continuation of U.S. patent application Ser. No. 16/883,195, filed on May 26, 2020, now U.S. Pat. No. 11,532,729 issued on Dec. 20, 2022, which is a continuation of U.S. patent application Ser. No. 15/962,398, filed on Apr. 25, 2018, now U.S. Pat. No. 10,665,696 issued on May 26, 2020, which is a divisional of U.S. patent application Ser. No. 14/285,281, filed May 22, 2014, now U.S. Pat. No. 9,972,702 issued on May 15, 2018, which are incorporated herein by reference.

BACKGROUND

Semiconductor manufacturers routinely fabricate multilayer semiconductor structures to achieve a high level of integration. The semiconductor structures have multiple devices, such as transistors, formed in a substrate. Multiple metallization layers are formed over the substrate to electrically interconnect the devices and form functional circuits. The metallization layers may also include other devices, such capacitors and resistors.

Each layer of a multilayer semiconductor structure is patterned one or more times using lithography techniques such as photolithography, electron-beam lithography, and the like. As the technology node shrinks the lithography techniques face many challenges. For example, photolithography and electron-beam lithography methods are limited by light diffraction and electron scattering, respectively. Fabrication problems are particularly severe for the semiconductor structures with sub-10 nm features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
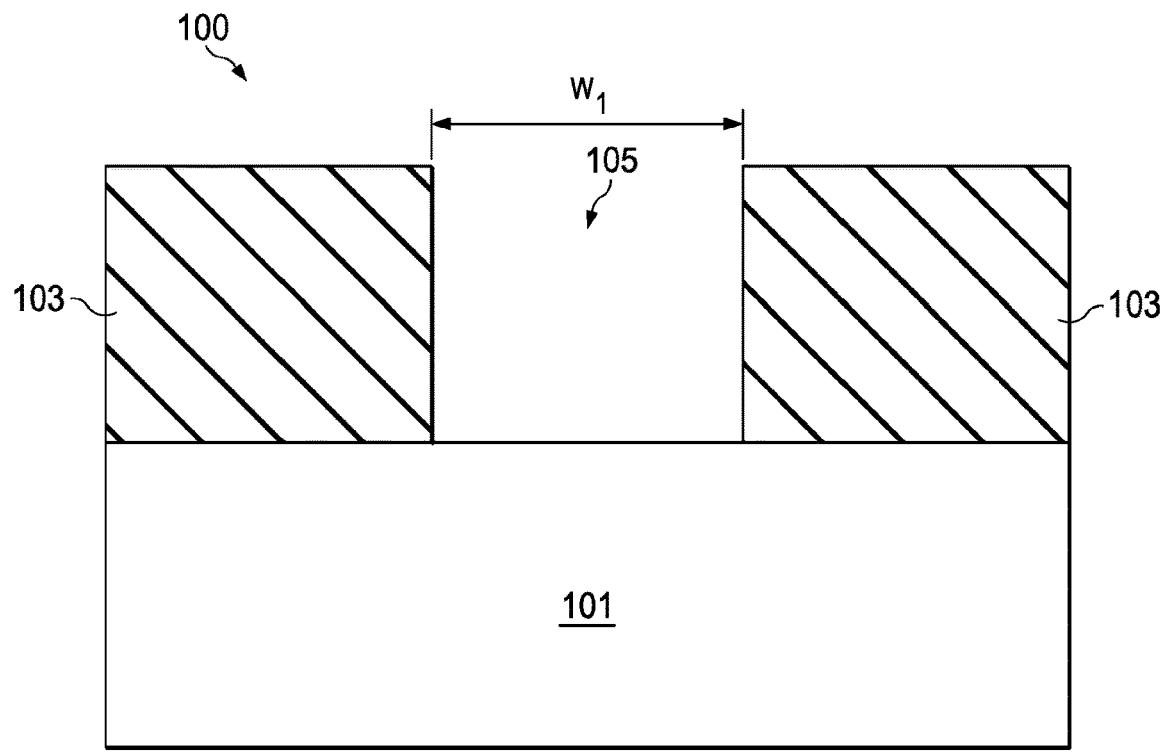
FIGS. 1-13 are cross-sectional views illustrating various intermediate stages of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated go degrees or at other orientations) and the spatially relative descriptors used herein may likewise be interpreted accordingly.

A method for forming a semiconductor device using fewer lithography processes is provided. In particular, a method for forming a fin structure will be described in greater detail below. However, persons skilled in the art will recognize that similar methods may be also applied to form other semiconductor structures, such as, for example, nanowires, and the like. As described below in greater detail, the method utilizes hard masks that are patterned using self-aligned processes and relies less on photolithography processing. Advantageous features of the method include that the method is suitable for fabrication sub-10 nm features and is not limited, for example, by light diffraction, electron scattering, or the like.

FIGS. 1-9 are cross-sectional views illustrating various intermediate stages of forming a semiconductor device 100 in accordance with some embodiments. Referring to FIG. 1, there is shown the semiconductor device 100 comprising a substrate lol and a sacrificial layer 103 over the substrate 101, the sacrificial layer 103 having an opening 105. The substrate 101 may comprise, for example, bulk silicon, doped or undoped, silicon germanium (SiGe), III-V compounds such as GaAs, InP, GaP, GaN, AlGaN, InGaN and the like, or an active layer of a semiconductor-on-insulator (SOI) substrate. Generally, an SOI substrate comprises a layer of a semiconductor material, such as silicon, silicon germanium, silicon carbide, or the like, formed on an insulator layer. The insulator layer may be, for example, a buried oxide (BOX) layer or a silicon oxide layer. The insulator layer is provided on a substrate, typically a silicon substrate or a glass substrate. Other substrates, such as multi-layered or gradient substrates may also be used.

The sacrificial layer 103 may comprise one more layers formed of materials such as insulators, semiconductors, or metals. As discussed in greater detail below, the sacrificial layer 103 is utilized to aid the fin structure formation process and, for example, may be used as a mask layer. In some embodiments, the sacrificial layer 103 is removed after forming the fin structure.

The sacrificial layer 103 may be patterned to form the opening 105 using, for example, photolithography techniques. Generally, a photoresist material (not shown) is deposited, irradiated (exposed), and developed to remove a portion of the photoresist material. The remaining photoresist material protects the underlying material from subsequent processing steps, such as etching. In this example, the photoresist material is used to form a patterned mask (not shown) to protect sections of the sacrificial layer 103 while etching the opening 105 in the sacrificial layer 103. Subsequently, the photoresist material is removed using, for example, an ashing process in combination with a wet clean process.

The sacrificial layer 103 is etched to remove exposed portions of the sacrificial layer 103 to form opening 105 in the sacrificial layer 103. The sacrificial layer 103 is etched, for example, by an anisotropic wet etch process or an anisotropic dry etch process. The anisotropic dry etch process may include physical dry etching, chemical dry etching, reactive ion etching, or similar. In an embodiment, the opening 105 is formed having a first width $W_1$ between about 10 nm and about no nm.

Figure 2:
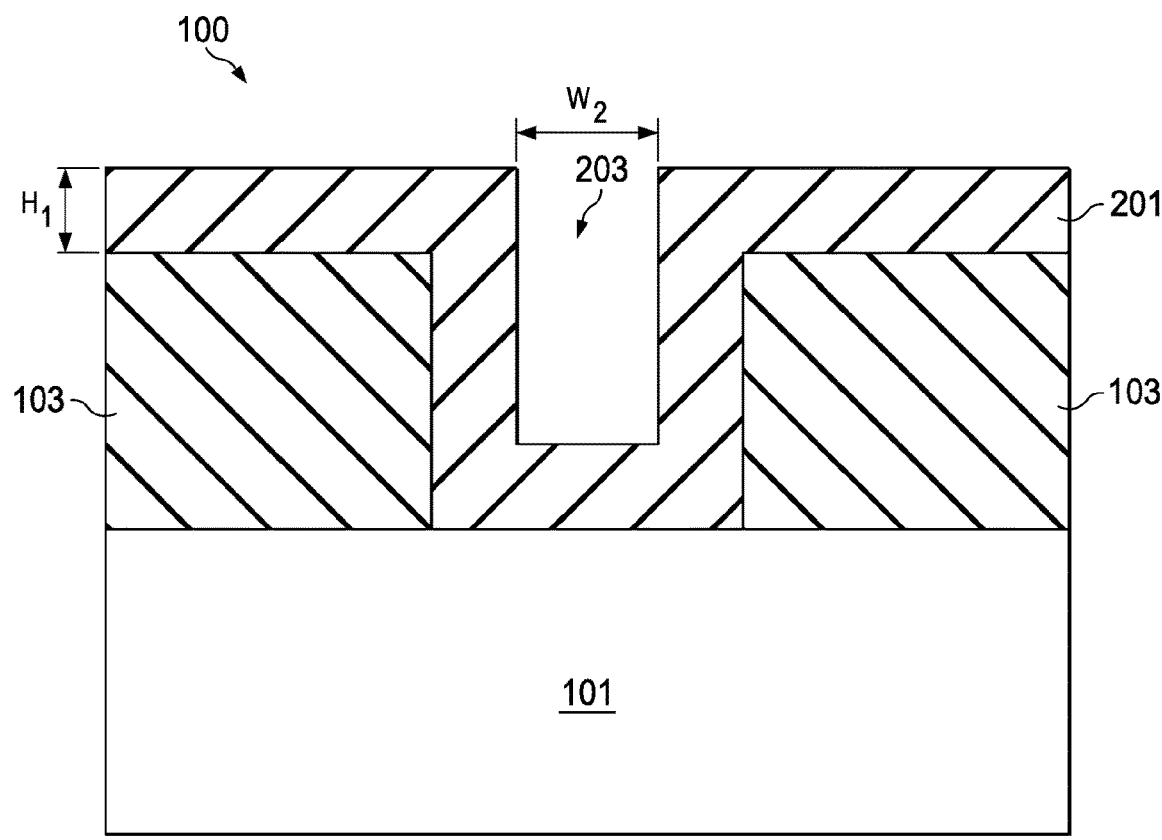

Referring to FIG. 2, a first hard mask 201 is formed over the sacrificial layer 103 and in the opening 105. In some embodiments, the first hard mask 201 may comprise $Al_2O_3$, AlN, AlP, AlAs, $Al_xTi_yO_z$, $Al_xCr_yO_z$, $Al_xZF_yO_z$, $Al_xHf_yO_z$, $Al_xSi_yO_z$, $B_2O_3$, BN, $B_xP_yO_z$, $BiO_x$, $Bi_xTi_yO_z$, BaS, $BaTiO_3$, CdS, CdSe, CdTe, CaO, CaS, $CaF_2$, $CuGaS_2$, CoO, $CoO_x$, $Co_3O_4$, $CrO_x$, $CeO_2$, $Cu_2O$, CuO, $Cu_xS$, FeO, $FeO_x$, GaN, GaAs, GaP, $Ga_2O_3$, $GeO_2$, $HfO_2$, $Hf_3N_4$, HgTe, InP, InAs, $In_2O_3$, $In_2S_3$, InN, InSb, $LaAlO_3$, $La_2S_3$, $La_2O_2S$, $La_2O_3$, $La_2CoO_3$, $La_2NiO_3$, $La_2MnO_3$, MoN, $Mo_2N$, $Mo_xN$, $MoO_2$, MgO, $MnO_x$, MnS, NiO, NbN, $Nb_2O_5$, PbS, $PtO_2$, $PO_x$, $P_xB_yO_z$, RuO, $Sc_2O_3$, $Si_3N_4$, $SiO_2$, SiC, $Si_xTi_yO_z$, $Si_xHf_yO_z$, $SnO_2$, $Sb_2O_5$, SrO, $SrCO_3$, $SrTiO_3$, SrS, $SrS_{1-x}Se_x$, $SrF_2$, $Ta_2O_5$, $TaO_xN_y$, $Ta_3N_5$, TaN, $TaN_x$, $Ti_xZr_yO_z$, $TiO_2$, TiN, $Ti_xSi_yN_z$, $Ti_xHf_yO_z$, $VO_x$, $WO_3$, $W_2N$, $W_xN$, $WS_2$, $W_xC$, $Y_2O_3$, $Y_2O_2S$, $ZnS_{1-x}Se_x$, ZnO, ZnS, ZnSe, ZnTe, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, Ru, Pt, Pd, Rh, Ag, Al, Ir, Cu, Ti, Ta, Mo, W, Ni, Co, Fe, and combinations thereof. The first hard mask 201 may be formed using, for example, atomic layer deposition (ALD) method. The ALD method provides conformal step coverage for the opening 105, as well as accurate thickness control, excellent uniformity, and low defect density for the first hard mask 201. In addition, the ALD method has high reproducibility. In an embodiment, the first hard mask 201 is formed having a first thickness $H_1$ between about 1 nm and about 50 nm.

Referring further to FIG. 2, the opening 105 is partially filled by the first hard mask 201 and a nanogap 203 is formed. In an embodiment, the nanogap 203 is formed having a second width $W_2$ between about 1 nm and about 20 nm.

As will be explained in greater detail below, the first hard mask 201 will be used to create a mask in the nanogap 203, after which the first hard mask 201 will be removed to expose portions of the underlying substrate 101. The exposed portions of the substrate 101 will be etched to form trenches, with the substrate 101 between adjacent trenches forming a fin. Accordingly the width of the nanogap corresponds to the width between the adjacent trenches, e.g., a width of the fin to be formed in subsequent processing steps. As such, a width of the opening 105 and a thickness of the first hard mask 201 may be adjusted to achieve a desired width of the nanogap 203 and, hence, a desired width of the subsequently formed fin.

Figure 3:
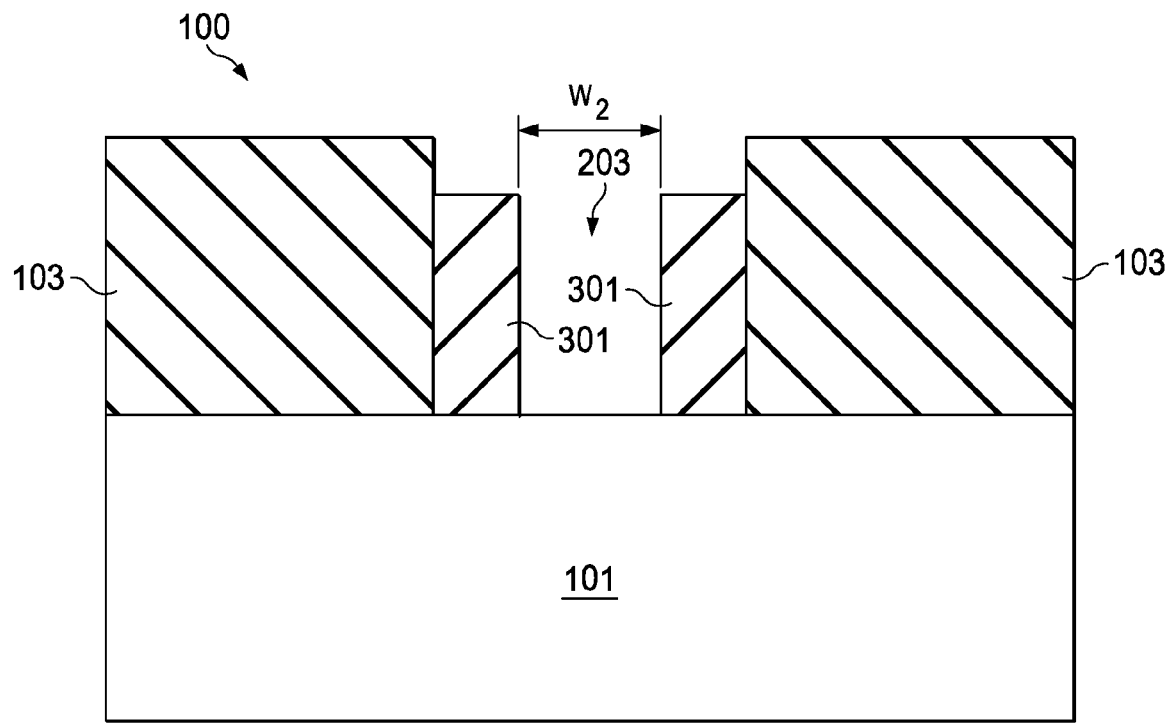

Referring now to FIG. 3, the first hard mask 201 is anisotropically etched to form a first patterned hard mask 301 in accordance with some embodiments. The etching process may recess an upper surface of the first patterned hard mask 301 below an upper surface of the sacrificial layer 103 as illustrated in FIG. 3. In other embodiments, the upper surface of the first patterned hard mask 301 may be above the upper surface of the sacrificial layer 103. In some embodiments, the first hard mask 201 is anisotropically etched using, for example, ion milling method. For example, in an embodiment in which the first hard mask 201 is formed of silicon oxide, the first hard mask 201 may be anisotropically etched using reactive ion etching method with a tetrafluoromethane ($CF_4$) plasma. In another embodiment in which the first hard mask 201 is formed of $Al_2O_3$, the first hard mask 201 may be anisotropically etched using reactive ion etching method with $BCl_3$/Ar plasma. Referring further to FIG. 3, in some embodiments, the sacrificial layer 103 is partially removed while etching the first hard mask 201.

Figure 4:
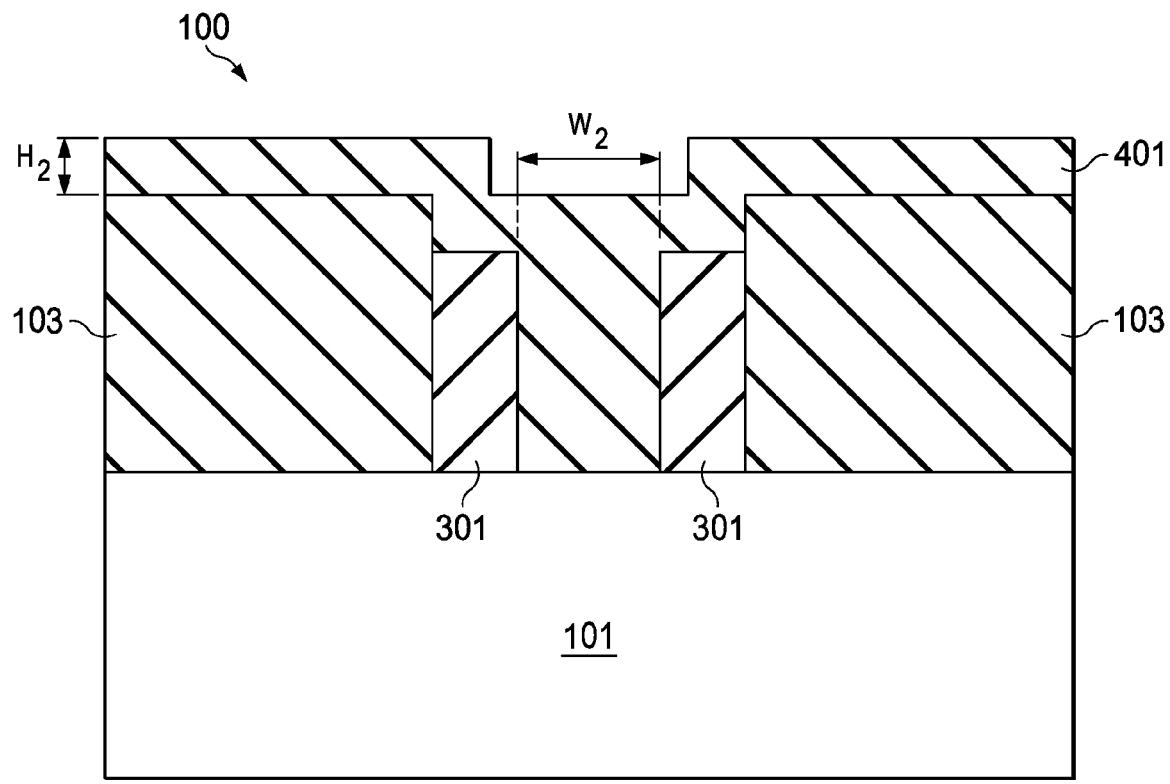

Referring to FIG. 4, a second hard mask 401 is formed over the sacrificial layer 103 and the first patterned hard mask 301 in accordance with some embodiments. In some embodiments, the second hard mask 401 may comprise $Al_2O_3$, AlN, AlP, AlAs, $Al_xTi_yO_z$, $Al_xCr_yO_z$, $Al_xZr_yO_z$, $Al_xHf_yO_z$, $Al_xSi_yO_z$, $B_2O_3$, BN, $B_xP_yO_z$, $BiO_x$, $Bi_xTi_yO_z$, BaS, $BaTiO_3$, CdS, CdSe, CdTe, CaO, CaS, $CaF_2$, $CuGaS_2$, CoO, $CoO_x$, $Co_3O_4$, $CrO_x$, $CeO_2$, $Cu_2O$, CuO, $Cu_xS$, FeO, $FeO_x$, GaN, GaAs, GaP, $Ga_2O_3$, $GeO_2$, $HfO_2$, $Hf_3N_4$, HgTe, InP, InAs, $In_2O_3$, $In_2S_3$, InN, InSb, $LaAlO_3$, $La_2S_3$, $La_2O_2S$, $La_2O_3$, $La_2CoO_3$, $La_2NiO_3$, $La_2MnO_3$, MoN, $Mo_2N$, $Mo_xN$, $MoO_2$, MgO, $MnO_x$, MnS, NiO, NbN, $Nb_2O_5$, PbS, $PtO_2$, $PO_x$, $P_xB_yO_z$, RuO, $Sc_2O_3$, $Si_3N_4$, $SiO_2$, SiC, $Si_xTi_yO_z$, $Si_xZr_yO_z$, $Si_xHf_yO_z$, $SnO_2$, $Sb_2O_5$, SrO, $SrCO_3$, $SrTiO_3$, SrS, $SrS_{1-x}Se_x$, $SrF_2$, $Ta_2O_5$, $TaO_xN_y$, $Ta_3N_5$, TaN, $Ti_xZr_yO_z$, $TiO_2$, TiN, $Ti_xSi_yN_z$, $Ti_xHf_yO_z$, $VO_x$, $WO_3$, $W_2N$, $W_xN$, $WS_2$, $W_xC$, $Y_2O_3$, $Y_2O_2S$, $ZnS_{1-x}Se_x$, ZnO, ZnS, ZnSe, ZnTe, $ZnF_2$, $ZrO_2$, $Zr_3N_4$, $PrO_x$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, Ru, Pt, Pd, Rh, Ag, Al, Ir, Cu, Ti, Ta, Mo, W, Ni, Co, Fe, and combinations thereof. The second hard mask 401 may be formed using, for example, atomic layer deposition (ALD) method. In an embodiment, the second hard mask 401 is formed having a second thickness $H_2$ between about 0.5 nm and about 10 nm.

As described below in greater detail, the first patterned hard mask 301 and the second hard mask 401 are selectively etched to form a mask, which is subsequently used to pattern the substrate 101. Therefore, in some embodiments, the first patterned hard mask 301 and the second hard mask 401 are formed of materials with different etch selectivities. For example, in an embodiment, the first patterned hard mask 301 is formed of silicon oxide and the second hard mask 401 is formed of silicon nitride. In another embodiment, the first patterned hard mask 301 is formed of $Al_2O_3$ and the second hard mask 401 is formed of Pt.

Figure 5:
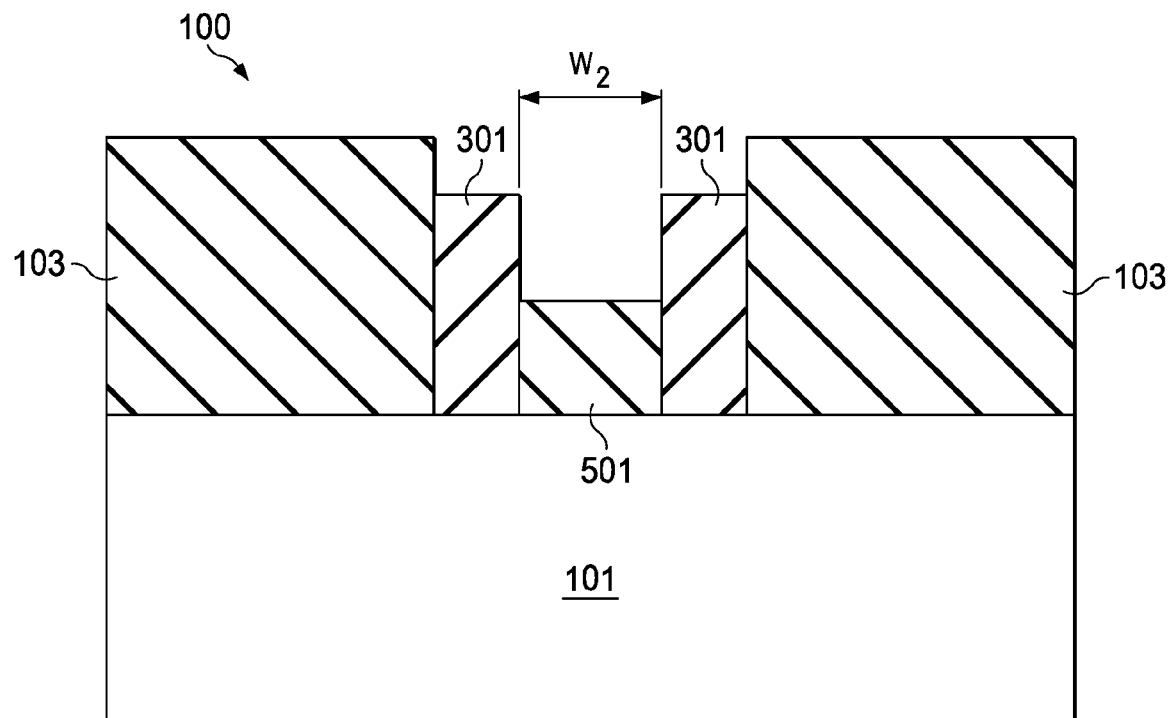

Referring to FIG. 5, the second hard mask 401 is selectively etched to form a second patterned hard mask 501 in accordance with some embodiments. In an embodiment with the first hard mask 201 formed of silicon oxide and the second hard mask 401 formed of silicon nitride, the second hard mask 401 may be selectively etched using, for example, hot phosphoric acid ($H_3PO_4$). In another embodiment with the first hard mask 201 formed of $Al_2O_3$ and the second hard mask 401 formed of Pt, the second hard mask 401 may be selectively etched using, for example, ion milling method, or the like. In an embodiment, the second patterned hard mask 501 is formed having the second width $W_2$, which corresponds to a width of a fin formed in subsequent processes. Referring further to FIG. 5, in some embodiments, portions of the sacrificial layer 103 may be removed while etching the second hard mask 401.

Figure 6:
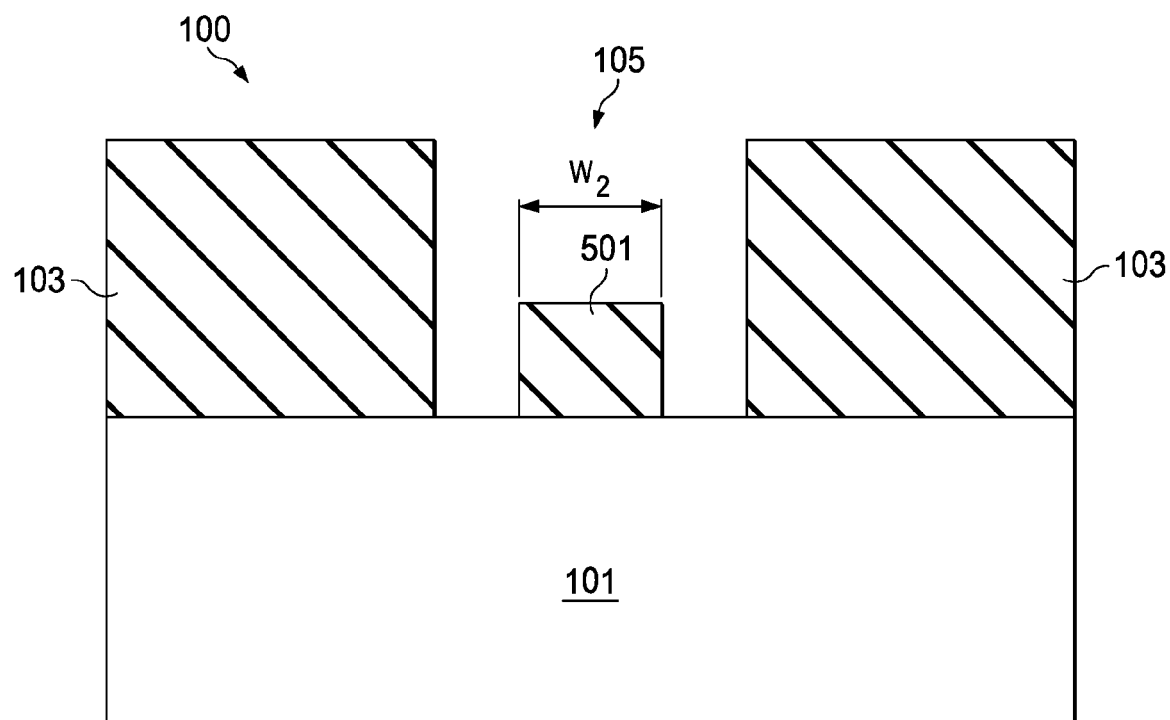

Referring to FIG. 6, in some embodiments, the first patterned hard mask 301 is selectively etched such that the second patterned hard mask 501 remains in the opening 105 of the sacrificial layer 103. In an embodiment with the first patterned hard mask 301 formed of silicon oxide and the second patterned hard mask 501 formed of silicon nitride, the first patterned hard mask 301 is selectively etched using, for example, buffered hydrofluoric acid (HF). In another embodiment with the first patterned hard mask 301 formed of $Al_2O_3$ and the second patterned hard mask 501 formed of Pt, the first patterned hard mask 301 is selective etched using, for example, reactive ion etching method with $BCl_3$/Ar plasma.

Figure 7:
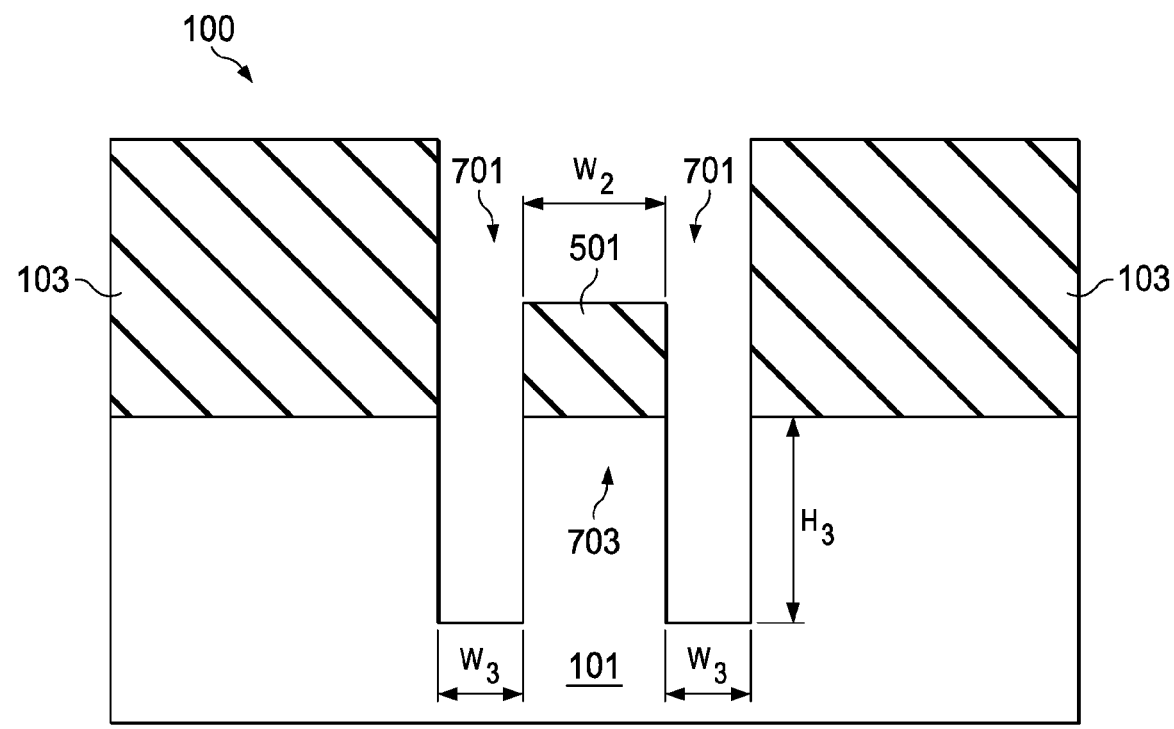

Referring to FIG. 7, the second patterned hard mask 501 is used to pattern the substrate 101 and thereby form a fin structure 703 in the substrate ion, in accordance with some embodiments. In some embodiments, the second patterned hard mask 501 and the sacrificial layer 103 form a mask over the substrate 101. The substrate 101 is etched to remove unprotected portions of the substrate 101 and to form trenches 701 in the substrate 101, wherein a portion of the substrate 101 between adjacent trenches forms the fin structure 703. The substrate 101 is etched, for example, by an anisotropic wet etch process or an anisotropic dry etch process. In an embodiment, the anisotropic wet etch may be performed on the substrate 101 comprising silicon using potassium hydroxide (KOH), ethylenediamine pyrocatechol (EDP), tetramethylammonium hydroxide (TMAH), or similar. The anisotropic dry etch process may include physical dry etching, chemical dry etching, reactive ion etching, ion milling, or similar. In an embodiment, the ions that are used in chemical dry etching of silicon are tetrafluoromethane ($CF_4$), sulfur hexafluoride ($SF_6$), nitrogen trifluoride ($NF_3$), chlorine gas ($Cl_2$), or hydrogen bromide (HBr). The typical reactive ion etching gasses for silicon are $CF_4$, $SF_6$ and $HBr+Cl_2$. The fin structure 703 comprising a single fin as illustrated in FIG. 7 is presented as an example only. In other embodiments, the fin structure 703 may comprise multiple fins interposed between adjacent trenches in the substrate 101.

In some embodiments, the trenches poi are formed to have a third width $W_3$ between about 1 nm and about 50 nm. In an embodiment, the fin structure 703 is formed to have the second width $W_2$, and a first height $H_3$ between about 1 nm and about 100 nm.

Figure 8:
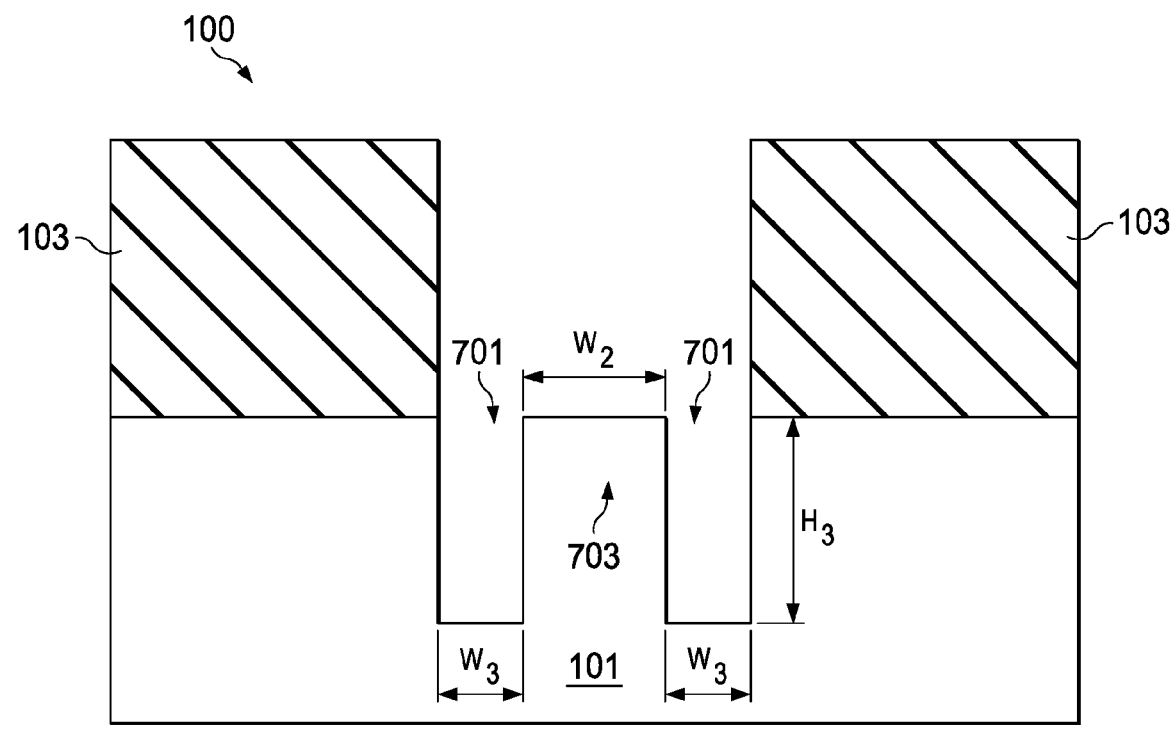

Referring to FIG. 8, the second patterned hard mask 501 is removed from a top surface of the fin structure 703 in accordance with some embodiments. In an embodiment with the second patterned hard mask 501 formed of silicon nitride, the second patterned hard mask 501 is removed, for example, by dipping in hot phosphoric acid ($H_3PO_4$). In an embodiment with the second patterned hard mask 501 formed of Pt, the second patterned hard mask 501 is removed using, for example, ion milling method with energetic Ar ions. Subsequently, the sacrificial layer 103 is removed from the top of the substrate 101 using a suitable etching process. In an embodiment, the sacrificial layer 103 is removed using, for example, ion milling method, wet chemical etching, or the like.

Figure 9:
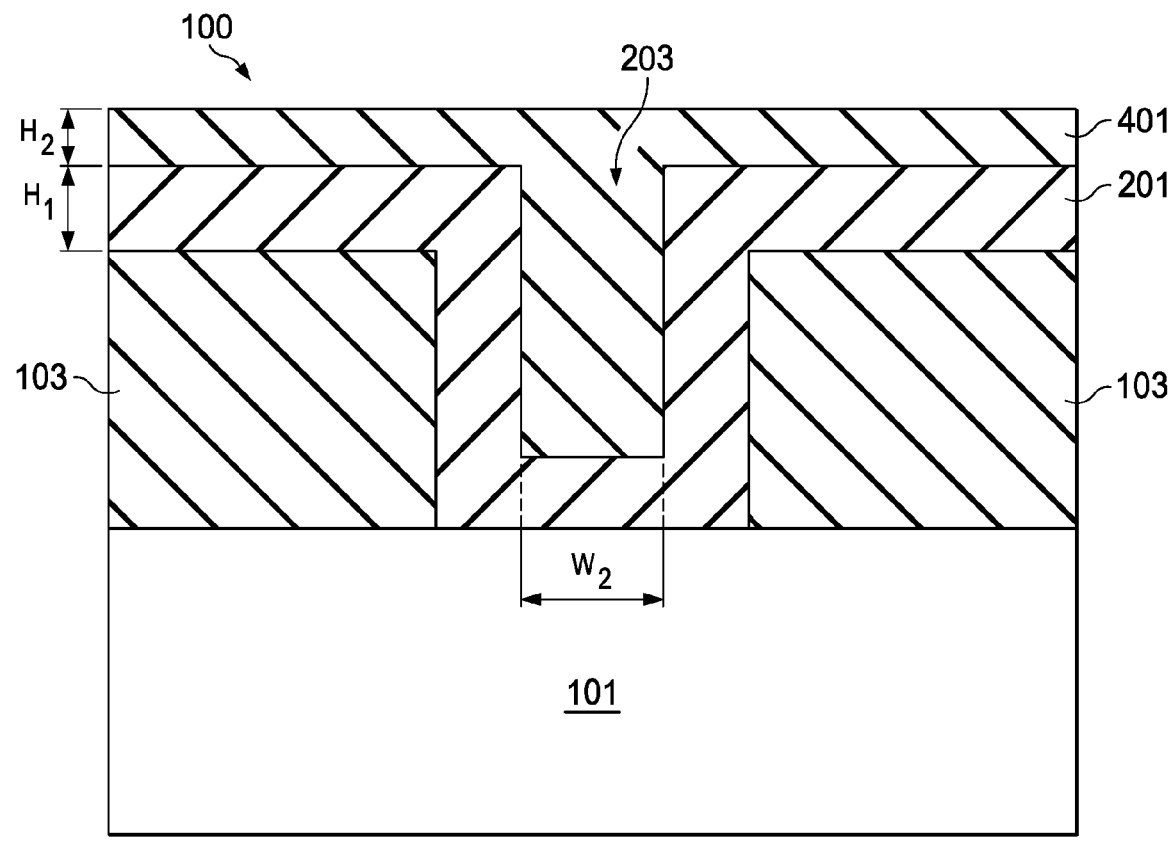

FIGS. 9-13 illustrate alternative steps, which may be performed to form the fin structure 703 in accordance with some embodiments. For example, after performing steps described above with reference to FIGS. 1 and 2, alternative steps such as those illustrated in FIGS. 9-13 may be performed. Referring first to FIG. 9, starting from a step described above with reference to FIG. 2, the second hard mask 401 is formed over the first hard mask 201, for example, using ALD method, or the like. In some embodiments, the second hard mask 401 completely fills the nanogap 203, as illustrated in FIG. 9.

Figure 10:
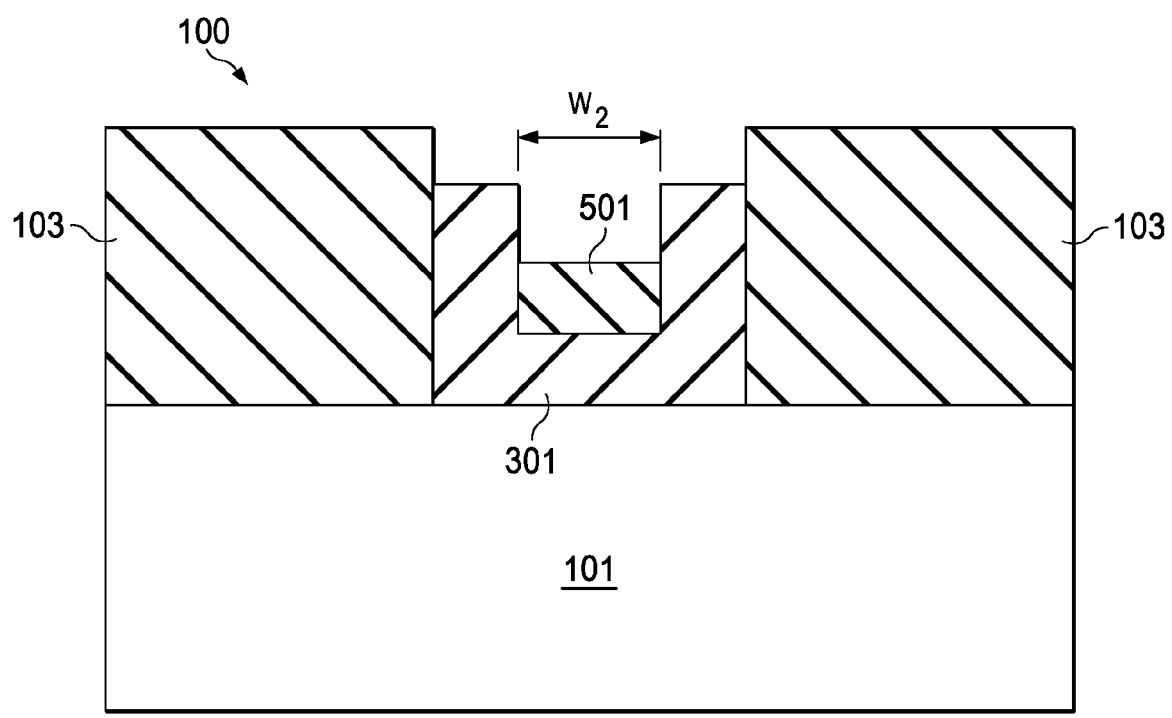

Referring to FIG. 10, the first hard mask 201 and the second hard mask 401 are anisotropically etched to form the first patterned hard mask 301 and the second patterned hard mask 501, respectively, as illustrated in FIG. 10. Due to the etch selectivity between the materials of the first hard mask 201 and the second hard mask 401, in some embodiments, the upper surface of the second patterned hard mask 501 is lower than the upper surface of the first patterned hard mask 301. In other embodiments, the upper surface of the second patterned hard mask 501 is higher than the upper surface of the first patterned hard mask 301.

In some embodiments such as that illustrated in FIG. 10, the material of the first hard mask 201 has a lower etch rate than the material of the second hard mask 401. As a result of the difference in the etch rates, the upper surface of the second patterned hard mask 501 is lower than the upper surface of the first patterned hard mask 301. For example, in an embodiment with the first hard mask 201 formed of silicon oxide and the second hard mask 401 formed of silicon nitride, the first hard mask 201 and the second hard mask 401 are anisotropically etched using, for example, reactive ion etching method with a sulfur hexafluoride ($SF_6$) plasma, which will remove the silicon oxide of the first hard mask 201 slower than the silicon nitride of the second hard mask 401. In another embodiment with the first hard mask 201 formed of $Al_2O_3$ and the second hard mask 401 formed of Pt, the first hard mask 201 and the second hard mask 401 are anisotropically etched using, for example, ion milling method, which will remove $Al_2O_3$ of the first hard mask 201 slower than Pt of the second hard mask 401.

Figure 11:
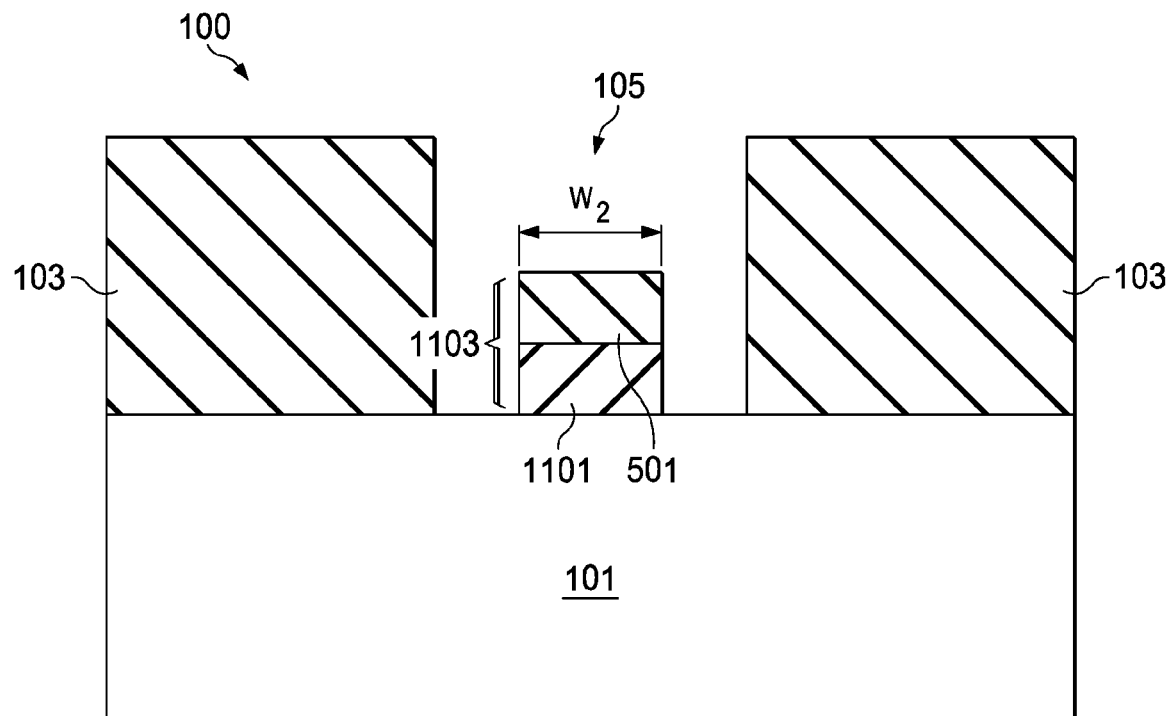

Referring to FIG. 11, in some embodiments, unprotected portions of the first patterned hard mask 301 are etched such that the second patterned hard mask 501 and a portion 1101 of the first patterned hard mask 301 remain in the opening 105 of the sacrificial layer 103. The second patterned hard mask 501 and the portion 1101 of the first patterned hard mask 301 form a third patterned hard mask 1103 on the substrate 101 as illustrated in FIG. 11. In an embodiment with the first patterned hard mask 301 formed of silicon oxide and the second patterned hard mask 501 formed of silicon nitride, the first patterned hard mask 301 is anisotropically etched using, for example, reactive ion etching method with a tetrafluoromethane ($CF_4$) plasma. In another embodiment with the first patterned hard mask 301 formed of $Al_2O_3$ and the second patterned hard mask 501 formed of Pt, the first patterned hard mask 301 is anisotropically etched using, for example, reactive ion etching method with $BCl_3$/Ar plasma.

Referring further to FIGS. 9-11, in some embodiments, process steps described above with respect to FIG. 10 may be bypassed and the third patterned hard mask 1103 of FIG. 11 may be formed by anisotropically etching the first hard mask 201 and the second hard mask 401 of FIG. 9. For example, the material of the first hard mask 201 may have a higher etch rate than the material of the second hard mask 401. As a result of the difference in the etch rates, once the first hard mask 201 is exposed, the first hard mask 201 extending along sidewalls of the sacrificial layer 103 is etched at a greater rate than the second hard mask 401, such that the first hard mask 201 is removed to expose the underlying substrate 101 prior to the second hard mask 401 being consumed. In an embodiment with the first hard mask 201 formed of silicon oxide and the second hard mask 401 formed of silicon nitride, the first hard mask 201 and the second hard mask 401 may be anisotropically etched using, for example, reactive ion etching method with a tetrafluoromethane ($CF_4$) plasma, which will remove the silicon oxide of the first hard mask 201 faster than the silicon nitride of the second hard mask 401. In another embodiment with the first hard mask 201 formed of $Al_2O_3$ and the second hard mask 401 formed of Pt, the first hard mask 201 and the second hard mask 401 may be anisotropically etched using, for example, reactive ion etching method with BCl$_3$/Ar plasma, which will remove Al$_2$O$_3$ of the first hard mask 201 faster than Pt of the second hard mask 401.

Figure 12:
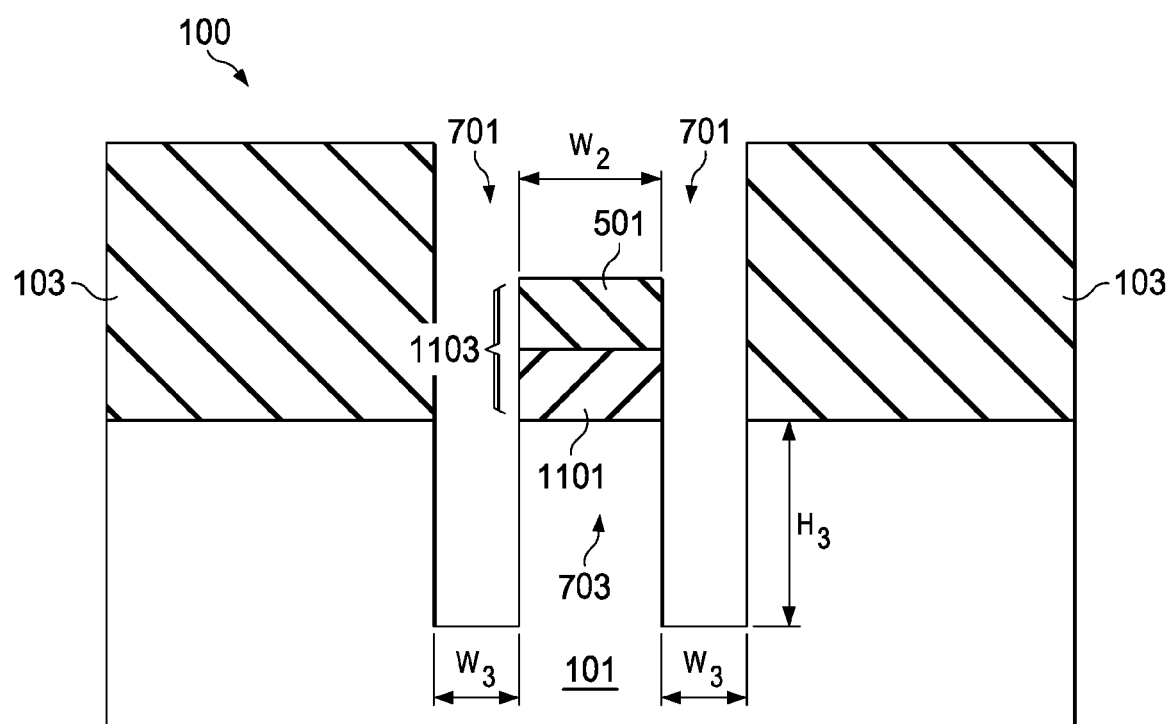

Referring to FIG. 12, the third patterned hard mask 1103 is used to pattern the substrate 101 and thereby form the fin structure 703 in the substrate 101, in accordance with some embodiments. In some embodiments, the fin structure 703 is formed using methods similar to those discussed above with reference to FIG. 7.

Figure 13:
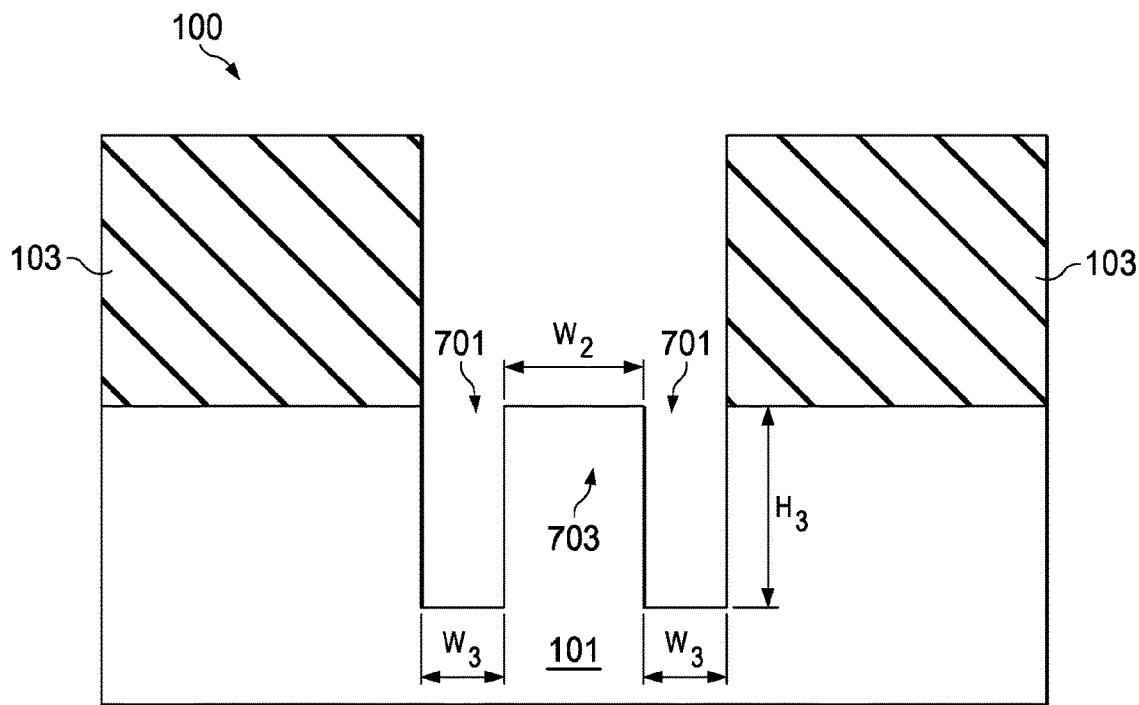

Referring to FIG. 13, the third patterned hard mask 1103 is removed from a top surface of the fin structure 703 in accordance with some embodiments. In an embodiment with the second patterned hard mask 501 formed of silicon nitride and the portion 1101 of the first patterned hard mask 301 formed of the silicon oxide, the second patterned hard mask 501 is removed, for example, by dipping in hot phosphoric acid (H$_3$PO$_4$), and the portion 1101 of the first patterned hard mask 301 is removed using, for example, buffered hydrofluoric acid (HF). In an embodiment with the second patterned hard mask 501 formed of Pt and the portion 1101 of the first patterned hard mask 301 formed of the Al$_2$O$_3$, the second patterned hard mask 501 is removed using, for example, ion milling method with energetic Ar ions, and the portion 1101 of the first patterned hard mask 301 is removed using, for example, reactive ion etching method with BCl$_3$/Ar plasma. Subsequently, the sacrificial layer 103 is removed from the top of the substrate 101 using a suitable etching process. In an embodiment, the sacrificial layer 103 is removed using, for example, ion milling method, wet chemical etching, or the like.

Figure 14:
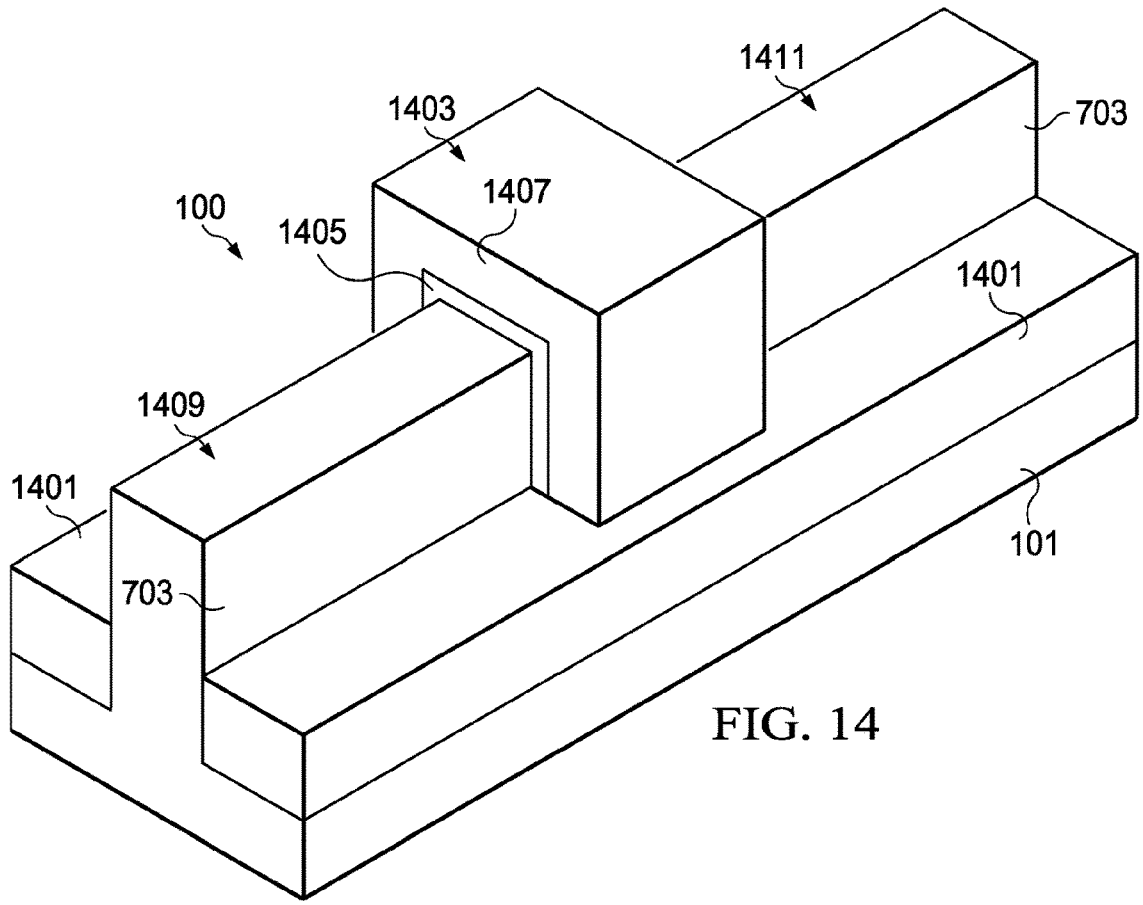
FIG. 14 is a three-dimensional view illustrating a semiconductor device in accordance with some embodiments.

Subsequently, the fin structure 703 may be utilized to form, for example, a fin field effect transistor (FinFET). FIG. 14 is a three-dimensional view illustrating the semiconductor device 100 represented as a FinFET device in accordance with some embodiments. In some embodiments, a liner oxide layer (not shown) such as silicon dioxide, or similar may be formed in the trenches 701, for example, by thermal oxidation process. Subsequently, the trenches are filled with a dielectric material to form shallow trench isolation (STI) regions 1401. The STI regions 1401 may comprise silicon oxide, silicon nitride, fluoride-doped silicate glass (FSG), or a low-K dielectric material, may also be used. In some embodiments, the STI regions 1401 may be formed using a high-density-plasma (HDP) CVD process, using silane (SiH$_4$) and oxygen (O$_2$) as reacting precursors. In other embodiments, the STI regions 1401 may be formed using a sub atmospheric CVD (SACVD) process or high aspect-ratio process (HARP), wherein process gases may comprise tetraethylorthosilicate (TEOS) and ozone (O$_3$). In yet other embodiments, the STI regions 1401 may be formed using a spin-on-dielectric (SOD) process, such as hydrogen silsesquioxane (HSQ) or methyl silsesquioxane (MSQ). Other processes and materials may be used. A chemical mechanical polishing (CMP) may be performed to remove excess portion of the dielectric material forming the STI regions 1401.

Subsequently, the STI regions 1401 are recessed, for example, by a selective wet etch or a selective dry etch process to expose portions of the fin structure 703 as illustrated in FIG. 14. In an embodiment, the STI regions 1401 are recessed by blanket wet etch process using HF acid, or the like. In some embodiment, a doped well (not shown) is formed in the substrate 101. The doped well may be formed, for example, by ion implantation method using suitable dopants.

Referring further to FIG. 14, a gate stack 1403 is formed over the fin structure 703. For example, the gate stack 1403 may be formed by depositing a dielectric layer and a conductive layer over the fin structure 703 by CVD, physical vapor deposition (PVD), atomic layer deposition (ALD), other suitable methods, and/or combinations thereof. A photolithography patterning process, including depositing a photoresist material, exposing according to a desired pattern, and developing, is used to pattern the dielectric layer and the conductive layer to form a gate dielectric 1405 and a gate electrode 1407 of the gate stack 1403, as illustrated in FIG. 14. The etching processes may include, for example, dry etching, wet etching, and/or other etching methods (e.g., reactive ion etching). The dielectric layer may comprise any suitable material, such as silicon oxide, silicon nitride, or a high-k dielectric material. The conductive layer may comprise highly doped polysilicon, a metallic material, or any suitable conductive material.

In some embodiments, optional spacers (not shown) may be formed alongside the gate stack 1403. The spacers may include one or more layers of a dielectric material such as silicon oxide, silicon nitride, silicon carbide, silicon oxynitride, or combinations thereof. The spacers may be formed by, for example, depositing a dielectric material over the gate structure and anisotropically etching the dielectric material.

A source region 1409 and a drain region 1411 are formed by doping the fin structure 703 on opposing sides of the gate stack 1403, as illustrated in FIG. 14. In some embodiments, the source region 1409 and the drain region 1411 are doped by ion implantation method using suitable dopants. For example, the source region 1409 and the drain region 1411 may be doped with n-type dopants, e.g., phosphorous or the like, to form an NMOS device in a p-doped substrate, or p-type dopants, e.g., boron or the like, to form a PMOS device in an n-doped substrate. Multiple doping processes may be utilized to create a desired doping profile, including, for example, lightly-doped drain (LDD) regions (not shown) and the like.

In some embodiments, an optional stress-inducing material (not shown) may be formed in the source region 1409 and the drain region 1411 along opposing sides of the gate stack 1403. Generally, an epitaxial material having a different lattice constant may be formed over the fin structure 703 or may replace a portion of the fin structure 703. The different lattice constants of the materials of the substrate 101 and the epitaxial material may induce a strain within the channel region, thereby increasing device performance. For example, in embodiments in which the substrate 101 is silicon, the epitaxial material may be Ge, SiC, GaAs, AlGaAs, SiGe, GaAsP, GaN, AlGaN, InGaN, or other suitable material.

In some embodiment, portions of the fin structure 703 may be removed and replaced with the stress-inducing material. For example, the STI regions 1401 may act as a mask for a selective etch process to recess exposed portions of the fin structure 703. In some embodiments, the etching process may be performed using a chemical selected from Cl, HBr, NF$_3$, CF$_4$, and SF$_6$ as an etching gas. A suitable semiconductor material may be epitaxially grown in recesses to form the source region 1409 and the drain region 411. The source region 1409 and the drain region 1411 may be in-situ doped during the epitaxial process and/or one or more subsequent doping process, e.g., an implant, may be performed.

The gate structure, as presented above with reference to FIG. 14, is for illustrative purposes only and other FinFET designs may be implemented according to functional requirements for the semiconductor device 100.

Further manufacturing steps may be performed on the semiconductor device 100. For example, an interlayer dielectric (ILD) layer (not shown) may be deposited over the source region 1409, the drain region 411, and the gate stack 1402. The ILD layer is formed of one or more layers of dielectric material, such as silicon oxide, oxynitride, low-k dielectrics or other suitable materials, by a suitable technique, such as CVD, ALD, and spin-on (SOG). A CMP process may be performed to remove excessive dielectric material from the ILD layer.

Subsequently, contacts (not shown) are formed to provide electrical contacts to the source region 1409, the drain region 411, and the gate stack 1403. The ILD layer may be patterned using photolithography techniques to form trenches and vias. The contacts are formed by depositing a suitable material in the trenches and the vias of the ILD layer using various deposition and plating methods, or similar. In addition, the contacts may include one or more barrier/adhesion layers (not shown) to protect the ILD layer from diffusion and metallic poisoning. The barrier layer may comprise titanium, titanium nitride, tantalum, tantalum nitride, or other alternatives. The barrier layer may be formed using PVD, CVD, or the like.

The material of the contacts may comprise copper, a copper alloy, silver, gold, tungsten, tantalum, aluminum, and the like. In an embodiment, the steps for forming the barrier layer and the contacts may include blanket forming barrier layer, depositing a thin seed layer of a conductive material, and filling the trenches and the vias in the ILD layer with the conductive material, for example, by plating. A CMP is then performed to remove excess barrier layer and the conductive material.

Figure 15:
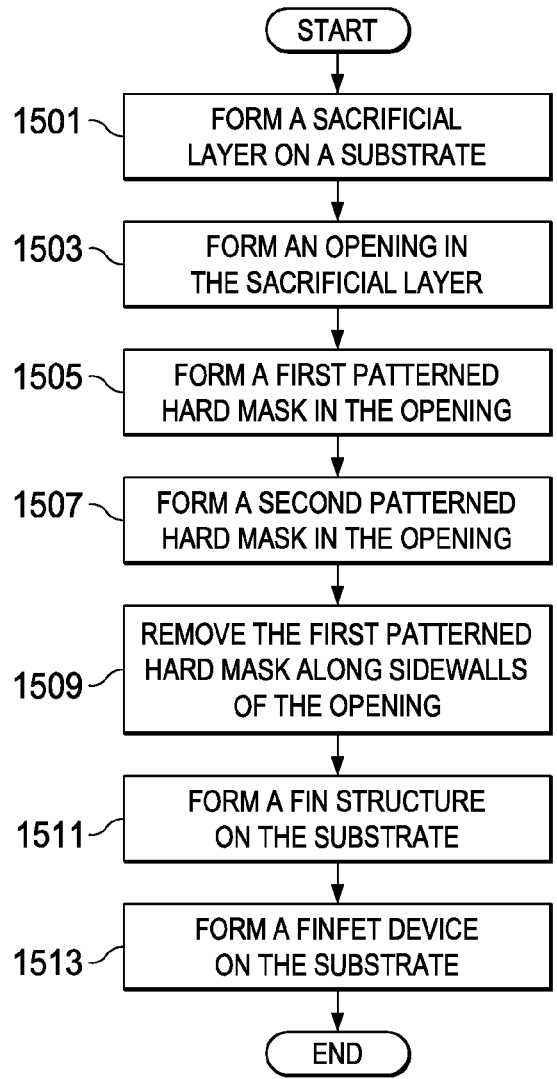
FIG. 15 is a flowchart illustrating a semiconductor device fabrication method in accordance with some embodiments.

FIG. 15 is a flowchart illustrating a method that may be used for fabricating a semiconductor device in accordance with some embodiments. The method starts with step 1501, wherein a sacrificial layer 103 is formed on a substrate 101. In step 1503, an opening 105 is formed in the sacrificial layer 103, as described above with reference to FIG. 1. Subsequently, in step 1505, a first hard mask 201 is formed over the sacrificial layer 103 and in the opening 105, as described above with reference to FIG. 2. In addition, the opening 105 is partially filled by the first hard mask 201, and a nanogap 203 is formed in the sacrificial layer 103, as described above with reference to FIG. 2. The first hard mask 201 is etched to form a first patterned hard mask 301 as described above with reference to FIG. 3. In step 1507, a second hard mask 401 is formed over the sacrificial layer 103, the first patterned hard mask 301, and in the nanogap 203. Subsequently, the second hard mask 401 is etched to form a second patterned hard mask 501, as described above with reference to FIG. 5. In step 1509, the first patterned hard mask 301 is removed, as discussed above with reference to FIG. 6. Next, in step 1511, the substrate 101 is etched and trenches 701 are formed in the substrate 101, as discussed above with reference to FIG. 7. A portion of the substrate 101 between adjacent trenches 701 forms a fin structure 703. Subsequently, the second patterned hard mask 501 is removed from the top of the fin structure 703, as described above with reference to FIG. 8. Finally, in step 1513, a FinFET device is formed on the substrate 101, as described above with reference to FIG. 14. To form the FinFET device, the sacrificial layer 103 is removed from the substrate 101, the STI regions 1401 are formed in the trenches 701, a gate stack 1403 is formed over the fin structure 703, and portions of the fin structure that are not protected by the gate stack are doped to form a source region 1409 and a drain region 1411, as described above with respect to FIG. 14.

Figure 16:
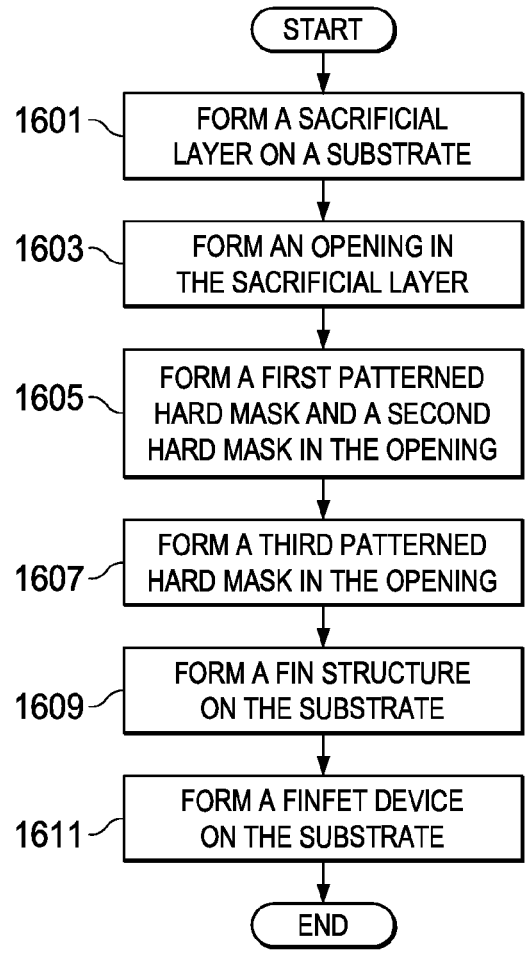
FIG. 16 is a flowchart illustrating a semiconductor device fabrication method in accordance with some embodiments.

FIG. 16 is a flowchart illustrating a method that may be used for fabricating a semiconductor device in accordance with some embodiments. The method starts with step 1601, wherein a sacrificial layer 103 is formed on a substrate 101. In step 1603, an opening 105 is formed in the sacrificial layer 103, as described above with reference to FIG. 1. Subsequently, in step 1605, a first hard mask 201 and a second hard mask 401 are formed over the sacrificial layer 103 and in the opening 105, as described above with reference to FIG. 9. The first hard mask 201 and the second hard mask 401 are etched to form a first patterned hard mask 301 and a second patterned hard mask 501, respectively, as described above with reference to FIG. 10. In step 1607, portions of the first patterned hard mask 301 along sidewalls of the opening 105 are etched to expose portions of the substrate 101 in the opening 105, and a third patterned hard mask 1103 is formed, as described above with respect to FIG. 11. Next, in step 1609, the substrate 101 is etched and trenches 701 are formed in the substrate 101, as described above with reference to FIG. 12. A portion of the substrate 101 between adjacent trenches 701 forms a fin structure 703. Subsequently, the third patterned hard mask 1103 is removed from the top of the fin structure 703, as described above with reference to FIG. 13. Finally, in step 1611, a FinFET device is formed on the substrate 101 as described above with reference to FIG. 14. To form the FinFET device, the sacrificial layer 103 is removed from the substrate 101, the STI regions 1401 are formed in the trenches 701, a gate stack 1403 is formed over the fin structure 703, and portions of the fin structure that are not protected by the gate stack are doped to form a source region 1409 and a drain region 1411 as described above with respect to FIG. 14.

It should be noted that the FinFET device, as described above with reference to FIG. 14, is provided for illustrative purposes only and other devices may be formed that use the fin structure 703 described above with reference to FIG. 1-13. For example, in other embodiments, the fin structure 703 may be used to form protruding nanowires, and the like.

In an embodiment, a method for forming a semiconductor device, the method comprises providing a substrate, forming a first patterned mask on the substrate, the first patterned mask having a first opening. The method further comprises forming a second patterned mask on the substrate in the first opening, the first patterned mask and the second patterned mask forming a combined patterned mask, the combined patterned mask having one or more second openings, and the substrate having unmasked portions in the one or more second openings. The method further comprises forming trenches in the substrate corresponding to the unmasked portions of the substrate in the one or more second openings.

In another embodiment, a method for forming a semiconductor device, the method comprises providing a substrate, forming a first patterned mask on the substrate, the first patterned mask having a first opening exposing at least a first portion of the substrate. The method further comprises forming a second patterned mask on the first portion of the substrate in the first opening, wherein one or more second portions of the substrate remain exposed in the first opening, and forming trenches in the substrate corresponding to the one or more second portions of the substrate.

In yet another embodiment, a method for forming a semiconductor device, the method comprises providing a substrate, forming a first patterned mask on the substrate, the first patterned mask having a first opening, and forming a second patterned mask on the substrate in the first opening, the substrate having one or more unprotected regions, the one or more unprotected regions being regions of the substrate unprotected by the first patterned mask and the second patterned mask. The method further comprises forming trenches in the substrate corresponding to the one or more unprotected regions of the substrate in the first opening, a portion of the substrate between neighboring trenches forming a fin structure. The method further comprises forming a gate stack on the fin structure, and forming a source region and a drain region in the fin structure, the source region and the drain region being formed on opposing sides of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a patterned sacrificial layer over a substrate, the patterned sacrificial layer having a first opening exposing the substrate;
   depositing a first mask layer over the patterned sacrificial layer and in the first opening, an upper surface of the first mask layer having a recess;
   depositing a second mask layer over the first mask layer and in the recess;
   patterning the second mask layer and patterning the first mask layer to form a first patterned mask and a second patterned mask in the first opening, wherein patterning the second mask layer comprises etching the second mask layer with a first etch, and wherein patterning the first mask layer comprises etching the first mask layer with the first etch;
   after patterning the second mask layer and the first mask layer, removing unprotected portions of the first patterned mask, wherein the second patterned mask and a protected portion of the first patterned mask remain after the unprotected portions of the first patterned mask are removed; and
   etching trenches in the substrate using the second patterned mask and the protected portion of the first patterned mask as a combined mask.

2. The method of claim 1, wherein removing the unprotected portions of the first patterned mask comprises etching the unprotected portions of the first patterned mask with a second etch, the first etch removing a material of the first mask layer slower than a material of the second mask layer, the second etch removing the material of the second mask layer slower than the material of the first mask layer.

3. The method of claim 2, wherein the material of the first mask layer is silicon oxide, the material of the second mask layer is silicon nitride, the first etch is a reactive ion etch performed with a sulfur hexafluoride plasma, and the second etch is a reactive ion etch performed with a tetrafluoromethane plasma.

4. The method of claim 2, wherein the material of the first mask layer is aluminum oxide, the material of the second mask layer is platinum, the first etch is an ion milling, and the second etch is a reactive ion etch performed with BCl$_3$/Ar plasma.

5. The method of claim 1, wherein removing the unprotected portions of the first patterned mask comprises etching the unprotected portions of the first patterned mask with the first etch, the first etch removing a material of the first mask layer faster than a material of the second mask layer.

6. The method of claim 5, wherein the material of the first mask layer is silicon oxide, the material of the second mask layer is silicon nitride, and the first etch is a reactive ion etch performed with a tetrafluoromethane plasma.

7. The method of claim 5, wherein the material of the first mask layer is aluminum oxide, the material of the second mask layer is platinum, and the first etch is a reactive ion etch performed with BCl$_3$/Ar plasma.

8. The method of claim 1, wherein an upper surface of the second patterned mask is lower than an upper surface of the first patterned mask.

9. The method of claim 1, wherein an upper surface of the second patterned mask is higher than an upper surface of the first patterned mask.

10. A method comprising:
    forming a patterned sacrificial layer over a substrate, the patterned sacrificial layer having a first opening exposing the substrate;
    depositing a first mask layer over the patterned sacrificial layer and in the first opening, an upper surface of the first mask layer having a recess;
    depositing a second mask layer over the first mask layer and in the recess;
    patterning the second mask layer and the first mask layer to form a patterned mask, wherein patterning the second mask layer and the first mask layer comprises etching the second mask layer and the first mask layer with an anisotropic etch, the anisotropic etch removing a material of the first mask layer faster than a material of the second mask layer; and
    patterning a fin in the substrate using the patterned mask, a width of the fin corresponding to a width of the patterned mask.

11. The method of claim 10, wherein the material of the first mask layer is silicon oxide, the material of the second mask layer is silicon nitride, and the anisotropic etch is a reactive ion etch performed with a tetrafluoromethane plasma.

12. The method of claim 10, wherein the material of the first mask layer is aluminum oxide, the material of the second mask layer is platinum, and the anisotropic etch is a reactive ion etch performed with BCl$_3$/Ar plasma.

13. The method of claim 10, wherein the first mask layer is deposited using an atomic layer deposition method, and the second mask layer is deposited using an atomic layer deposition method.

14. A method comprising:
    forming a patterned sacrificial layer over a substrate, the patterned sacrificial layer having a first opening exposing the substrate;
    depositing a first mask layer over the patterned sacrificial layer and in the first opening, an upper surface of the first mask layer having a recess;
    depositing a second mask layer over the first mask layer and in the recess;
    patterning the second mask layer and the first mask layer to form a patterned mask, wherein patterning the second mask layer and the first mask layer comprises:

etching the second mask layer until the first mask layer is exposed and until an upper surface of the second mask layer is lower than an upper surface of the patterned sacrificial layer; and etching the first mask layer until the substrate is exposed; and patterning a fin in the substrate using the patterned mask.

15. The method of claim 14, wherein a width of the fin corresponds to a width of the patterned mask.

16. The method of claim 14, wherein a material of the first mask layer is silicon oxide, a material of the second mask layer is silicon nitride, and etching the second mask layer comprises etching the silicon oxide and the silicon nitride with a sulfur hexafluoride plasma.

17. The method of claim 14, wherein a material of the first mask layer is silicon oxide, a material of the second mask layer is silicon nitride, and etching the first mask layer comprises etching the silicon oxide and the silicon nitride with a tetrafluoromethane plasma.

18. The method of claim 14, wherein a material of the first mask layer is aluminum oxide, a material of the second mask layer is platinum, and etching the second mask layer comprises etching the aluminum oxide and the platinum with ion milling.

19. The method of claim 14, wherein a material of the first mask layer is aluminum oxide, a material of the second mask layer is platinum, and etching the first mask layer comprises etching the aluminum oxide and the platinum with $BCl_3$/Ar plasma.

20. The method of claim 14, wherein the first mask layer is deposited using an atomic layer deposition method, and the second mask layer is deposited using an atomic layer deposition method.

* * * * *